United States Patent [19]

Kluge et al.

[11] Patent Number: 5,315,121
[45] Date of Patent: May 24, 1994

[54] METAL ION SOURCE AND A METHOD OF PRODUCING METAL IONS

[75] Inventors: Andreas Kluge, Nuremberg; Peter Nelle, Munich, both of Fed. Rep. of Germany

[73] Assignee: Fraunhofer-Gesellschaft zur Forderung der Angewandten Forschung e.V., Munich, Fed. Rep. of Germany

[21] Appl. No.: 778,807

[22] PCT Filed: Aug. 31, 1990

[86] PCT No.: PCT/DE90/00666

§ 371 Date: Dec. 13, 1991

§ 102(e) Date: Dec. 13, 1991

[87] PCT Pub. No.: WO91/06969

PCT Pub. Date: May 16, 1991

[30] Foreign Application Priority Data

Oct. 24, 1989 [DE] Fed. Rep. of Germany ....... 3935408

[51] Int. Cl.$^5$ .......................................... H01J 37/08
[52] U.S. Cl. ............................. 250/423 R; 250/492.21; 315/111.91
[58] Field of Search ............... 250/423 R, 423 F, 424, 250/396 R, 492.3, 492.2 R, 492.21; 313/362.1, 363.1; 315/111.81, 111.91

[56] References Cited

U.S. PATENT DOCUMENTS

| | | | |
|---|---|---|---|
| 4,851,693 | 7/1989 | Fisher | 250/492.21 |
| 5,162,699 | 11/1992 | Tokoro et al. | 315/111.81 |

FOREIGN PATENT DOCUMENTS

| | | |
|---|---|---|
| 58-042150 | 3/1983 | Japan . |
| 59-149643 | 8/1984 | Japan . |

Primary Examiner—Jack I. Berman
Assistant Examiner—Jim Beyer
Attorney, Agent, or Firm—Ralph H. Dougherty

[57] ABSTRACT

For simplifying the structure of a metal ion source, in particular for implanting into semiconductor wafers small doses of metals which are hard to vaporize, the metal ion source includes an electrically heatable thermionic cathode in the form of a heating wire within an ion chamber, the heating wire being arranged adjacent a metallic component, which consists of the metal intended to give off the metal ions, and being essentially at the potential of the metallic component.

7 Claims, 2 Drawing Sheets

METAL ION SOURCE AND A METHOD OF PRODUCING METAL IONS

BACKGROUND OF THE INVENTION

The present invention relates to a metal ion source comprising a gas-filled ion chamber for producing gas ions, which are accelerated onto a metallic component consisting of the metal intended to give off the metal ions and which, upon hitting the metallic component, release metal atoms therefrom, the metal atoms being, in turn, ionized.

The present invention also relates to a method of generating metal ions, which is especially useful for implanting ions into semiconductor wafers for producing doped semiconductor structures, in which case gas ions are first produced, whereupon the gas ions are accelerated onto a metallic component consisting of the metal intended to give off the metal ions, whereupon metal atoms are released from the metallic component when the gas ions impinge thereon, the metal ions being then ionized.

In the field of semiconductor technology, so-called sputter sources are used, e.g., for applying metal to the surfaces of semiconductor wafers. This metal, which can, for example, be gold or platinum and which is applied to the surface of a semiconductor wafer by sputtering, is diffused into the semiconductor body after having been applied to the surface thereof so that a specific doping and, consequently, a specific reduction of the lifetime of minority carriers is achieved.

In the case of a known sputter source, argon ions are first produced within an ion chamber and within a first electric field. A target consisting of the donor metal, which is intended to give off the metal ions, is positioned in a separate structure within the ion chamber and has applied thereto a separate potential for generating a separate electric field within which the gas ions are accelerated onto the target for the purpose of releasing metal atoms. Also the subsequent ionization and post-acceleration of the sputtered metal atoms takes place in a separate electric field, which is independent of the electric field used for ionizing the argon gas.

The known metal ion source in the form of the above-described sputter source must be equipped with at least two high-voltage sources, which are independent of each other, which makes the known metal ion source technically complicated and expensive. Furthermore, at least two separate electrode leads with adequate insulating devices must be provided; in the case of the metal ion sources of the type in question, these insulating devices must be complicated ceramic insulating devices. In addition, implantations of very small metal doses in the order $10^{14}$ cm$^2$ which are required for lifetime doping in the case of semiconductors, prove to be difficult in the case of the known metal ion source.

Furthermore, metal vaporization methods and metal vaporizing sources are known, by means of which metal can be deposited on a body to be coated. Examples of these technologies are described in German patent 2827647, German Auslegeschrift 2521536, German Auslegeschrift 2364379 as well as German Offenlegungsschrift 1765636. In the evaporation technique of German OLS 1765636, a rod of the metallic component to be evaporated is arranged in the vicinity of a heating spiral, and a high d.c. voltage potential is used between the heating spiral and the rod of the material to be evaporated. However, such evaporation technologies are neither suitable for implanting very small metal doses of the above-mentioned magnitude, nor can they be used in the case of all compounds, since e.g. the metal platinum does not contain suitable compounds on the basis of which it would be possible to evaporate platinum at the temperatures of approximately 800° C. prevailing within an evaporation source at a sufficiently high vapor pressure.

OBJECT OF THE INVENTION

A principal object of the present invention is to provide a metal ion source for producing metal ions for implanting in structures in such a way that the metal ion source has a simplified structure.

Another object of the present invention is to provide a method of generating metal ions in such a way that the method can be used for producing also small metal doses in a reliable manner and with minor expenditure of processing technology.

SUMMARY OF THE INVENTION

The present invention is based on the finding that, when the thermionic cathode constructed as a heating wire is arranged within the ion chamber in the vicinity of the metallic component intended to give off the metal ions, it will be possible to achieve a substantial simplification and improvement of the metal ion source according to the prior art, which has been described at the beginning and which operates in accordance with the sputtering method. The metal ion source according to the present invention employs a single electric field for generating the gas ions, for accelerating the gas ions onto the metallic component intended to give off the metal ions and for subsequently ionizing the released metal atoms, the electric field being produced between the thermionic cathode constructed as a heating wire and an anode, which can be defined by the wall of the ion chamber. It follows that, in the case of the subject matter of the present invention, it is no longer necessary to use two separate high-voltage sources for applying a potential to two electrodes, as has been the case with the metal ion source according to the prior art, which has been explained earlier. Accordingly, the insulating inserts for the cathode in the case of the metal ion source according to the present invention are much simpler than the insulating inserts for the electrodes in the case of the known metal ion source.

The method of generating metal ions according to the present invention employs a single electric field for emitting electrons from the thermionic cathode in the form of the heating wire, for effecting gas ionization, for accelerating the gas ions and for subsequently ionizing the released metal atoms as well as for post-accelerating the metal ions. It follows that, within this single electric field used for the above-mentioned purposes, electrons are first emitted from the thermionic cathode for ionizing the gas. The emitted electrons are accelerated within this electric field for ionizing the gas after having passed the mean free travelling distance. The thus produced gas ions are, in turn, accelerated in this electric field such that they move towards the metallic component. The metal atoms released from the metallic component are ionized by means of the electrons emitted by the thermionic cathode in the form of a heating wire. The thus formed metal ions are accelerated under the influence of this electric field. In contrast to the metal ion generation method according to the prior art, in the case of which the sequence of method steps taken for generating the gas ions is completely separate from the sequence of method steps taken for generating the metal ions, the metal ion generation method according to the invention is a uniform process requiring, in contrast to the method according to the prior art, neither separate fields nor any separation in the sequence of the various methods steps.

The invented metal ion generation method according to the present invention is particularly important with regard to the implantation of small doses of doping metals, such as platinum. This implantation method permits a precise controllability of the doping which can be achieved by metal ion implantation.

BRIEF DESCRIPTION OF THE DRAWING

In the following detailed description, a preferred embodiment of the invented metal ion source and a preferred embodiment of the invented metal ion generation method are explained in detail with reference to the appended drawings in which.

DETAILED DESCRIPTION

Figure 1:
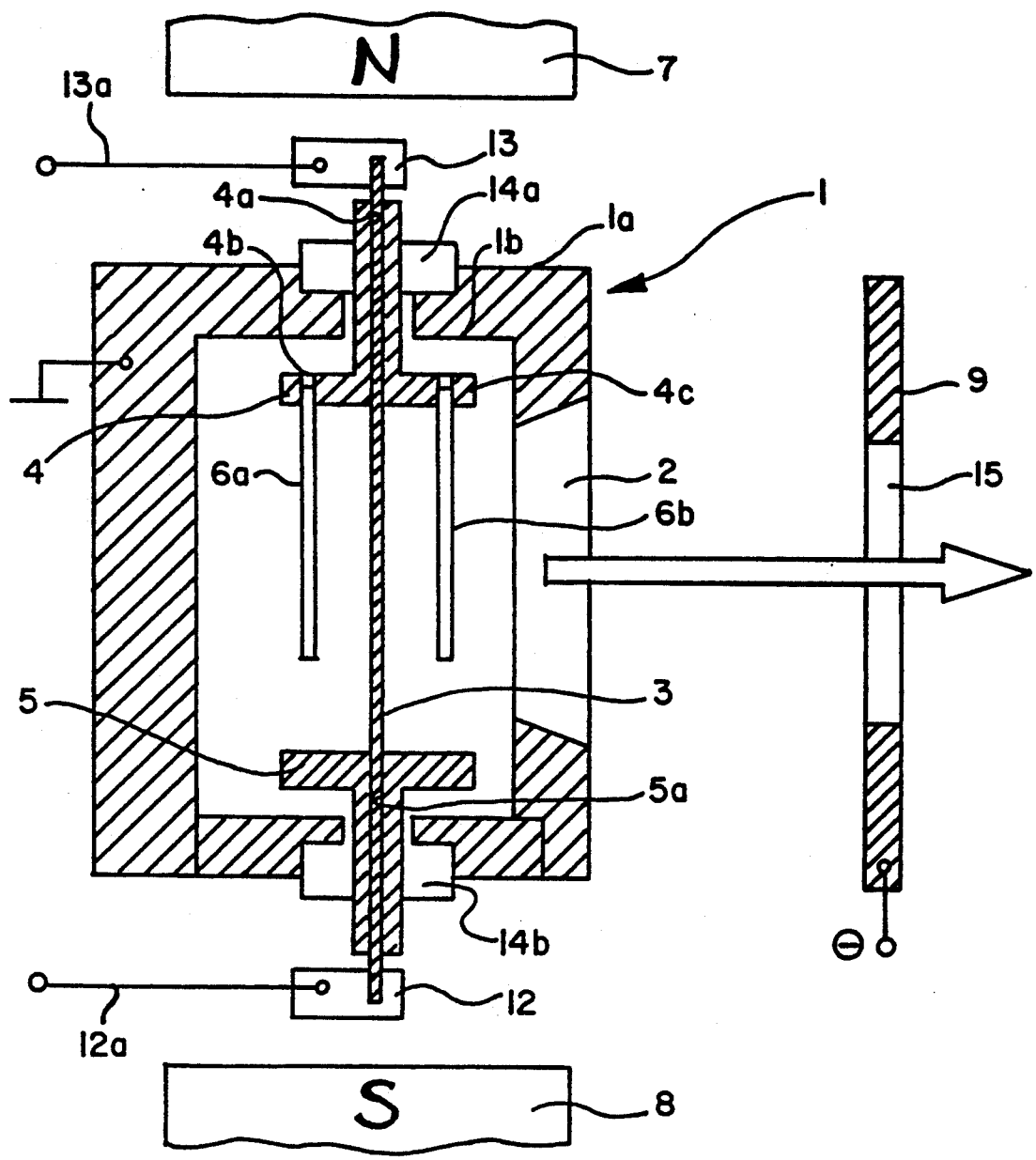
FIG. 1 is a sectional view through an embodiment of the metal ion source according to the present invention.
Figure 2:
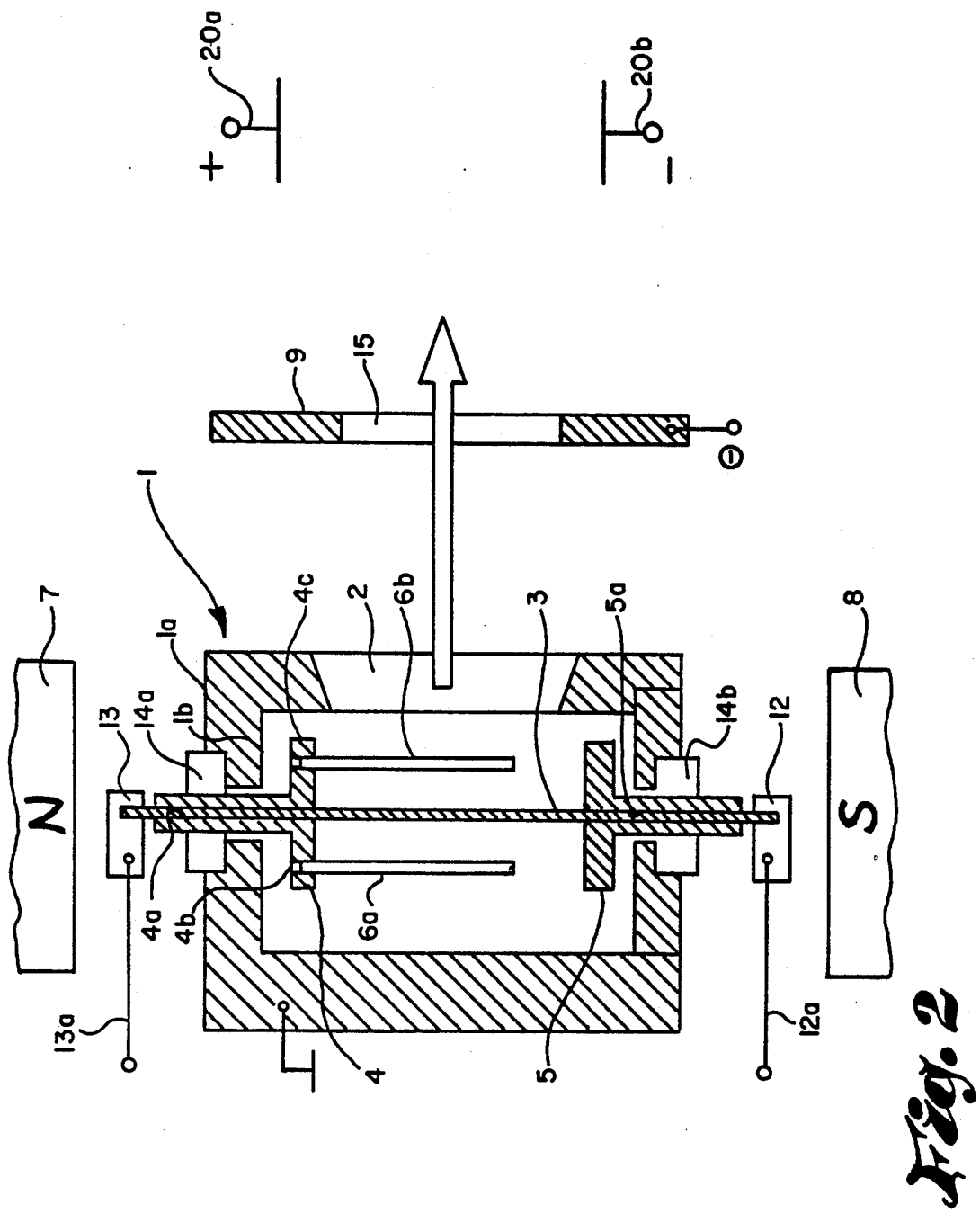
FIG. 2 is a sectional view through an alternative embodiment of the metal ion source including an electrostatic deflection unit.

The ion source, reference numeral 1, includes an ion chamber 1a having a conductive chamber wall 1b, which is preferably made of a special steel. The chamber wall 1b defines the anode of the ion source 1. The ion chamber 1a has an outlet opening 2 on one side thereof, through which metal ions can be discharged. An electrically heatable thermionic cathode in the form of a heating wire 3 extends through the ion chamber 1a, the heating wire consisting of tungsten in the preferred embodiment. The heating wire 3 has supplied thereto a heating current via connection electrodes 12, 13, such heating current being sufficiently strong for making the heating wire 3 glow. The leads 12a, 13a, the electrodes 12, 13 and the heating wire 3 connected thereto are insulated from the conductive chamber wall 1b of the ion chamber 1a by ceramic insulating rings 14a, 14b. Each of the ceramic insulating rings abuts on its inner side against an electron reflector 4, 5. The electron reflectors consist of a conductive material, preferably a special steel. The electron reflectors 4, 5 are, in turn, provided with an internal bore 4a, 5a. The heating wire 3 is firmly enclosed by the internal bores 4a, 5a of the electron reflectors 4, 5 and is in electrically conductive contact therewith. The electrodes 12 and 13, respectively, have applied thereto a potential, which is negative in comparison with the mass potential of the conductive chamber wall 1b, so as to produce an electric field between the thermionic cathode and the anode defined by the chamber wall 1b. The voltage between the anode and the thermionic cathode is chosen to be so high that a glow discharge takes place within the ion chamber 1a.

A metallic component 6, which consists of the metal intended to give off the metal ions, has applied thereto essentially the same potential as the electron reflectors 4, 5 and, consequently, the heating wire 3. In the case of the preferred embodiment, the metallic component 6 comprises at least two metal wires 6a, 6b, which extend parallel to the heating wire 3 and which are press-fitted in holes 4b, 4c of one of the two electron reflectors 4.

The ion chamber 1a is filled with an ionizable gas, the gas being argon in the case of the preferred embodiment. However, as will be evident to the person skilled in the art, it is equally possible to use some other ionizable gas, and in this respect chlorine is especially advantageous.

The magnetic poles 7, 8 of a magnetic field generation device are positioned above and below the ion chamber 1a, the magnetic field generation device generating a magnetic field which extends through the ion chamber 1a parallel to the heating wire 3.

Outside of the ion chamber 1a, an extraction electrode 9 is provided, having an electrode aperture 15, which has applied thereto a negative potential.

An essential aspect of the invented metal ion source is that the metallic component 6a, 6b, which is intended to give off the metal ions, is so arranged adjacent the heating wire 3 that metallic component 6a, 6b is heated by heating wire 3. By means of this forced heating of the metallic component 6, which may, for example, be provided in the form of metal wires 6a, 6b as shown, contaminations on the surface of the metallic component 6 are eliminated, whereby sputtering of the metal is improved. In addition, the increase of the sputtering rate at high temperatures is advantageous and useful.

Another essential aspect of the present invention that the metallic component is substantially at the potential of the heating wire 3. Preferably, the metallic component 6 is conductively connected to the heating wire. It is, however, also possible to permit, in comparison with the voltage between the heating wire 3 and the chamber wall 1b, small difference between the potential of the heating wire 3 and that of the metallic component 6.

The ion source 1 works in accordance with the metal ion generation method explained below. In a first method step, the heating wire 3 is heated, by means of an adequate supply of current, to a high temperature of approximately 2000° C., the temperature being, however, lower than the melting temperature of the heating wire. By applying an adequate voltage between the heating wire 3, which acts as a thermionic cathode, and the chamber wall 1b of the ion chamber 1a, which acts as an anode, a single electric field is generated within the ion chamber 1a. In this electric field, the electrons discharged from the thermionic cathode in the form of the heating wire 3 are first accelerated in the radial direction, and, due to the magnetic field extending perpendicularly through their initial transit path, the electrons are forced into a helical path from the thermionic cathode heating wire 3 to the anode chamber wall 1b. The person skilled in the art will understand that the magnetic field only serves the purpose of increasing the distance traveled by the electrons between thermionic cathode and the chamber wall in comparison with the radial distance between these components for increasing thus the number of gas ion formations. It follows that, when a lower yield is accepted, it is also possible to operate the ion source 1 according to the present invention without any magnetic field. The argon ions produced by the impact of the electrons on the argon atoms are accelerated by the electric field in a reverse direction relative to the mean direction of movement of the electrons. The argon ions which hit the metal wires 6a, 6b release metal atoms from these wires. In the preferred embodiment, platinum atoms produced in this way are ionized by the electrons emitted by the heating wire 3.

The positively charged platinum ions, which are produced in the single electric field extending through the ion chamber 1a, are accelerated by the electric field in a radial, outward direction relative to the heating wire 3, the platinum ions discharged through the outlet opening 2 being post-accelerated by the field produced by the extraction electrode 9. The ion source 1 produces a platinum ion current in the direction of the arrow outlined in the figure.

The platinum ion beam is subjected to a selection in accordance with the relation of mass to charge of the ion beam particles, supplied to an additional post-acceleration unit and focussed. An electrostatic deflection unit 20a and 20b, provides uniform irradiation of a semiconductor wafer disc into which the metal ions are to be implanted. The invented implantation method is preferably used for implanting small doses of metal in semiconductor structures in the case of doses of a few $10^{12}$ atoms $cm^2 min^{-1}$.

We claim:

1. A metal ion source comprising a gas-filled ion chamber (1a) for producing gas ions, an electrically heatable thermionic cathode in the form of a heating wire (3), which is arranged within said ion chamber (1a), an anode (1b) and a metallic component (6) adapted to give off metal ions, wherein gas ions produced in said ion chamber are accelerated onto said metallic component (6) and upon striking said metallic component (6) release metal atoms therefrom, said metal atoms being, in turn, ionized, wherein
    said heating wire (3) and the metallic component (6) are at the same potential or show, relative to the voltage between the heating wire (3) and an anode (1b), only a small difference between their potentials,
    said heating wire (3) is arranged adjacent to said metallic component (6) such that said metallic component is heated by said heating wire (3), and
    said metallic component (6) extends substantially parallel to said heating wire (3) spaced at a substantially uniform radial distance therefrom.

2. A metal ion source according to claim 1 wherein the metallic component (6) is connected to the heating wire (3).

3. A metal ion source according to claim 1 wherein the heating wire (3) extends between two electron reflectors (4, 5), which consist of a conductive material and at least one (4) of which is constructed such that it supports the metallic component (6).

4. A metal ion source according to claim 1 wherein the metallic component consists of metal wire (6a, 6b).

5. A metal ion source according to claim 1 wherein the gas is argon or chlorine and that the metal of the metallic component (6) is platinum.

6. A method of generating metal ions for implanting metal ions into semiconductor wafers for producing doped semiconductor structures, providing a semiconductor wafer target, providing a metal component, producing gas ions, and heating a thermionic cathode in the form of a heating wire, characterized by the following method steps:
    generating, by the application of a voltage between the heating wire and an anode, a single electrode field for ionizing the gas, for accelerating the gas ions onto the metal component, and for subsequently ionizing the metal atoms released from the metal component;
    emitting electrons from the thermionic cathode under the influence of the electric field for ionizing the gas;
    accelerating the gas ions in said electric field so that said gas ions will impinge on the metal component and release metal atoms therefrom;
    ionizing the metal atoms by means of the electrons emitted by the thermionic cathode;
    accelerating the metal ions under the influence of the electric field; and
    implanting the metal ions in the semiconductor water target.

7. A method according to claim 6, characterized by the following additional method steps:
    post-accelerating the metal ions;
    carrying out a selection of the metal ion current in accordance with the relation of mass to charge;
    focussing the metal ion beam; and
    electrostatically or magnetically deflecting the metal ion beam so as to effect uniform irradiation of the semiconductor wafer disc to be implanted.

* * * * *